United States Patent [19]

Wakabayashi et al.

[11] Patent Number: 4,958,061
[45] Date of Patent: Sep. 18, 1990

[54] METHOD AND APPARATUS FOR HEAT-TREATING A SUBSTRATE

[75] Inventors: Tsuyoshi Wakabayashi, Kofu; Shigehito Ibuka, Higashiyamato, both of Japan

[73] Assignee: Tokyo Electron Limited, Tokyo, Japan

[21] Appl. No.: 371,807

[22] Filed: Jun. 27, 1989

[30] Foreign Application Priority Data

Jun. 27, 1988 [JP] Japan .................. 63-156679

[51] Int. Cl.$^5$ .................. H01L 21/477
[52] U.S. Cl. .................. 219/411; 219/390; 118/725; 118/729
[58] Field of Search .......... 219/390, 405, 411, 354; 118/724, 725, 728, 729; 432/258, 259

[56] References Cited

U.S. PATENT DOCUMENTS

| | | | |
|---|---|---|---|
| 2,311,942 | 2/1943 | Hagemeyer | 432/259 |
| 4,097,226 | 6/1978 | Erikson | 219/405 |
| 4,101,759 | 7/1978 | Anthony | 219/411 |
| 4,468,260 | 8/1984 | Hiramoto | 219/405 |
| 4,535,228 | 8/1985 | Mimura | 219/411 |
| 4,545,327 | 10/1985 | Campbell | 219/411 |
| 4,550,245 | 10/1985 | Arai | 219/411 |
| 4,649,261 | 3/1987 | Sheets | 219/411 |
| 4,755,654 | 7/1988 | Crowley | 219/411 |

FOREIGN PATENT DOCUMENTS 62-128525 6/1987 Japan .

Primary Examiner—Teresa J. Walberg
Attorney, Agent, or Firm—Oblon, Spivak, McClelland, Maier & Neustadt

[57] ABSTRACT

A heat-treating method and apparatus are disclosed which are employed for the manufacture of, for example, a semiconductor device. A substrate to be treated is set in a floating state with an air space defined relative to an underlying opposite surface. A ring-like temperature security member is located with a small gap left relative to an outer periphery of the substrate. The heating of the substrate is achieved in this state. Infrared lamps are selected as a heating source and the surface underlying the substrate provides a reflection surface. The rear surface of the substrate is heated by reflection light travelling across the aforementioned air space. A heat dissipation from the marginal edge portion of the substrate is prevented by the temperature security member to obtain uniformity of heat over the whole area of the substrate. The presence of the air space ensures the ready loading and unloading of the substrate and hence the ready operability. It is also possible to prevent generation of dust resulting from a frictional contact between the substrate and the opposite surface.

10 Claims, 2 Drawing Sheets

METHOD AND APPARATUS FOR HEAT-TREATING A SUBSTRATE

BACKGROUND OF THE INVENTION

1. Field of the Invention

The present invention relates to a heat-treating method and apparatus used in the manufacture of a semiconductor device, an LC (liquid crystal) drive circuit board etc., and more in particular to an improved heat-treating method and apparatus for obtaining a better heat uniformity on an object to be treated.

2. Description of the Related Art

Various types of heat-treating apparatuses are employed in the manufacture of a semiconductor device, an LC (liquid crystal) drive circuit board and so on. In recent times, a sheet-by-sheet type heat-treating apparatus has been highlighted which heat-treats substrates, such as semiconductor wafers, in a sheet-by-sheet fashion. One of such heat-treating apparatuses is of an infrared lamp (halogen lamp) type and, in the manufacturing process of, for example, a semiconductor device, the same type of heat-treating apparatus is employed in the activation of an ion-implanted layer of the wafer by an anneal step.

In the heat treatment by the infrared lamp, the task is to obtain the uniform heating of an object to be treated. In the step of annealing a semiconductor wafer, a greater heat dissipation occurs at the marginal edge portion of the wafer, resulting in a lowering of a prevailing temperature. As a result, thermal nonuniformity is produced on the wafer surface and hence a slip line is produced at the marginal edge portion of the wafer to a greater extent. In order to overcome the problem, Japanese Patent Disclosure (Kokai) No. 62-128525 proposes the use of a ring-like temperature security member. In the technique of this Disclosure, a semiconductor wafer is placed on a silicon wafer support board and a guard ring (temperature security member) which is the same material as the semiconductor wafer is disposed around the semiconductor wafer. Under this condition, the wafer is illuminated with infrared lamps to carry out an anneal step. This method prevents a heat dissipation from the marginal edge portion of a to-be-treated wafer by the guard ring. The guard ring is made of the same material as that of the to-be-treated wafer.

The aforementioned technique surely prevents a heat dissipation from the marginal edge portion of the wafer and leads to a uniform heating on the surface of the wafer. On the other hand, that surface of the wafer which is located on the "support board" side is not heated by the infrared lamps due to the whole undersurface of the wafer being in face contact with the support board, thus causing thermal nonuniformity in a direction of the cross-section of the wafer and the occurrence of slip lines.

Furthermore, the face contact of the whole undersurface of the wafer with the support board degrades a load/unload operation with respect to the wafer and is liable to produce dust upon the loading and unloading of the wafer onto and out of the support board. This cannot meet a high-speed operation and a cleaning requirement demanded in a semiconductor device fabricating process.

The aforementioned problem is not restricted to an infrared lamp illumination type heat treating apparatus and arises as a common problem among various devices for the heat treatment of the substrate, such as a semiconductor wafer.

SUMMARY OF THE INVENTION

An object of the present invention is to provide a method and apparatus for heat-treating a to-be-treated substrate, such as a semiconductor wafer, which can uniformly heat not only the substrate surface but also a whole substrate including a bulk and can prevent the occurrence of slip lines in the substrate.

Another object of the present invention is to provide method and apparatus as set forth above which can enhance a load/unload operation with respect to a to-be-treated substrate and can reduce the occurrence of dust at the load/unload time.

In order to achieve the object of the present invention, there is provided a method for heat-treaing at least one substrate at a time which basically comprises the steps of:

placing the substrate in a floated state with a spacing defined between a rear surface of the substrate and an opposite surface just below the substrate;

locating a ring-like temperature security member relative to the substrate with a small gap defined between an outer periphery of the substrate and the member; and heating the substrate and the member while maintaining the aforementioned positional relation. The positioning of the substrate and temperature security member can be achieved in this order or a reversed order.

Preferably, the aforementioned method further comprises:

initially positioning the temperature security member in a set relation;

supporting the substrate on a substrate support means, while positioning the substrate just beneath, and relative to, the temperature security member in a circumferential direction of said substrate; and lifting the substrate through the substrate support means so that the substrate is located inside the temperature security member. This preferred method ensures an automatic wafer load/unload operation under optimal conditions.

In another aspect of the present invention there is provided a apparatus for heat-treating at least one substrate at a time which comprises:

a chamber for defining a closed space for receiving a substrate;

infrared-ray lamp means located at an upper, inner surface of the chamber;

a platen providing a lower surface of the chamber, the upper inner surface of the platen being exposed to the inside of the chamber to provide a mirror-like reflection surface;

means for lifting the platen, the space of the chamber being closed or opened by moving the platen up and down by the lifting means so that the substrate is loaded into and out of the chamber;

means for supporting the substrate in a floating fashion just over the platen with an air spacing left between a rear surface of the substrate and the upper surface of the platen; and a ring-like temperature security member disposed relative to an outer periphery of the substrate to leave a small gap therebetween.

Preferably, the substrate support means is formed of plurality of heat-resistant pins (for example, three in number) for supporting the substrate thereon. The heat-resistant pins can elastically be moved up and down in association with spring means which is contained in the platen. More preferably, a window plate made of quartz is placed between the infrared lamp means and a position where the substrate is supported in which case the temperature security member is securely supported by quartz pins which are attached to the lower surface of the window plate.

The features and the other advantages of the present invention will become apparent from an explanation made in conjunction with the accompanying drawings.

BRIEF DESCRIPTION OF THE DRAWINGS

In FIG. 1, with a platen located in an upper extreme position, a substrate to be treated is shown held within a completely sealed space of a chamber as indicated by a solid line in FIG. 1 while, with the platen located in a lowest extreme position, the substrate can be replaced as will be seen from a dot-dash line in FIG. 1;

DETAILED DESCRIPTION OF THE PREFERRED EMBODIMENTS

Figure 1:
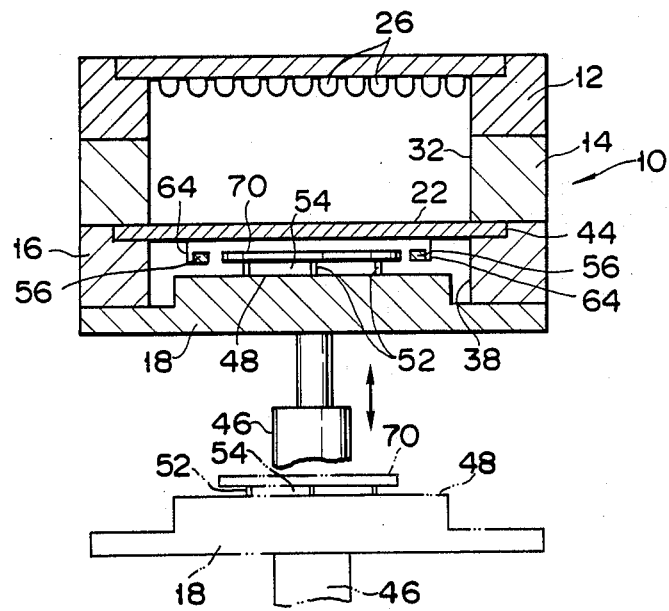
FIG. 1 is a view, in longitudinal cross-section, showing a heat-treating apparatus according to an embodiment of the present invention, as viewed from an arrow A in FIG. 1 with a member-to-member sealing means shown omitted for brevity.
Figure 2:
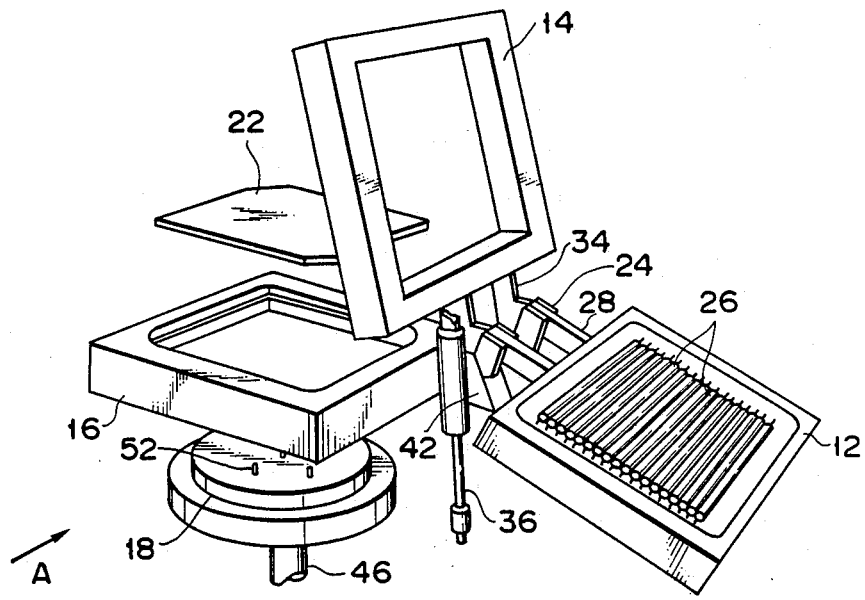
FIG. 2 is a perspective view showing a heat-treating apparatus of FIG. 1 with respective members completely developed or expanded.

In a heat-treating apparatus according to the present invention, a chamber 10 is constructed of a top plate 12, an upper frame 14 and lower frame 16 for forming side walls and a platen 18 and adapted to house and treat a object to be treated. These component parts of the chamber can be disassembled in such a manner as shown in FIG. 2 and assembled in such a manner as shown in FIG. 1 when they are used. In the assembled state, O-rings are fitted between the component parts to provide a complete air-tight space within the chamber 10. The O-rings are fitted in place between the component parts by the techniques known to the mechanical engineers in the art and omitted for brevity. Cooling systems, not shown, are associated with the component parts to prevent an adverse effect resulting from "overheating", such as the oxidation of respective component parts at the time of heating treatment. A pressure-reducing pipe and so on, not shown, are connected to the lower frame 16 of the chamber at a location opposite to hinge members 24 to properly control an atmosphere within the chamber which is necessary at the time of heat treatment.

The top plate 12 is of a hollow type and made of stainless steel and holds a cooling member therein. A number of a halogen-contained type infrared lamps 26 are arranged on the top plate 12 to provide a incoherent light source for heating. A pair of support legs 28 are connected to one side of the top plate 12 and swingably supported on a pair of associated hinges which are fitted to the lower frame 16.

The upper frame 14 is of a hollow type and made of stainless steel. A cooling member is held within the hollow frame 14. The inner surface 32 of a central opening of the upper frame 14 is Au-evaporated to provide a mirror-like surface. A pair of support legs 34 are connected to one side of the upper frame and swingably supported on the hinges 24 which are coupled to the lower frame 16. A pneumatic type damper 36 is coupled to the upper frame 14 to prevent a sudden drop of the top plate 12 and upper frame 14 during assembly.

The lower frame 16 is of a hollow type and made of stainless steel. A cooling member is housed within the hollow frame 16. Gold is evaporated on an inner surface 38 of a central opening of the lower frame 16 to provide a mirror-like inner surface. A pair of legs 42 are connected at one end to the lower frame 16 and provided with the hinges 24 which support the top plate 12 and upper frame 14.

A window plate 22 is made of quartz and sandwiched between the upper frame 14 and the lower frame 16. The plate 22 serves to allow passage of only a light beam which is effective to give heat. In the embodiment of the present invention, the window plate 22 is fitted in a recess 44 of the lower frame 16 during assembly and held down by the lower surface of the upper frame 14. A ring-like temperature security member 56 is supported beneath the lower surface of the window plate 22 as will be set forth below.

The platen 18 made of aluminum is of a hollow type and holds a cooling member therein. The plate 18 is supported by a stem 46 which is attached to a central lower surface of the platen 18 and which is associated with a lifting mechanism, not shown. As a result, the platen 18 is driven by the lifting mechanism and can be lifted between a position as indicated by a dot-dash line and a position as indicated by a solid line in FIG. 1.

Three support pins 52 are provided on an upper surface 48 of the platen 18 and made of a material resistant to a treating temperature, such as quartz. The respective support pin 52 is elastically movable up and down by means of a spring means held within the platen 18. A substrate 70 to be treated, such as a semiconductor wafer, is supported at three points by the three support pins 52. The substrate 70 is placed on the support pins 52 and so set as to be floated within the chamber 10, leaving an adequately great spacing 54 between the rear surface of the substrate 70 and the platen 18. Since the top surface 48 of the platen 18 is mirror-finished, the beam of light which passes through the quartz window plate 22 is reflected from the inner surface 38 of the lower frame and top surface 48 of the platen and past the spacing 54 onto the rear surface of the substrate 70 so that the rear surface of the substrate 70 is subjected to thermal illumination.

In place of supporting the substrate in a floated state by pins within the chamber, the substrate can be floated by jetting a gas upwardly from the top surface of the platen.

Figure 3:
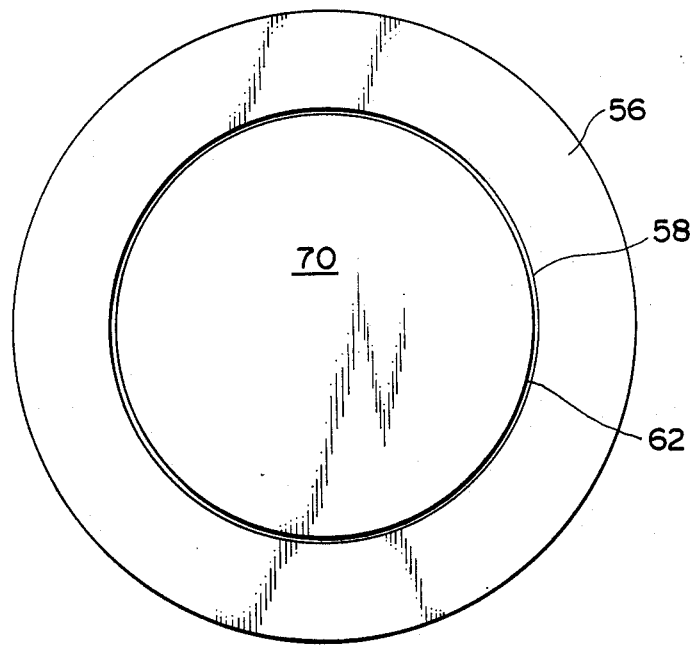
FIG. 3 is a plan view showing a relation of the substrate to a temperature security member at a time of heat treatment.
Figure 4:
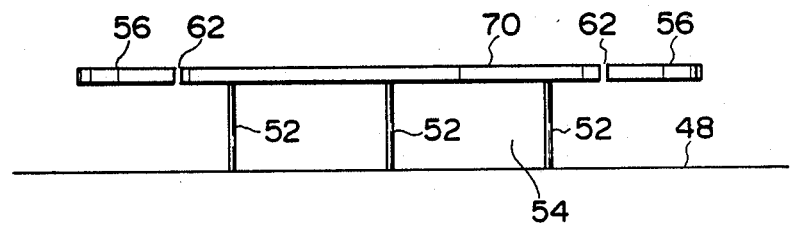
FIG. 4 is a longitudinal side view showing a relation between the substrate and the temperature security member at the time of heat treatment.

At the time of heat treatment, the ring-like temperature security member 56 is located around the substrate 70 as shown in FIGS. 3 and 4. For the temperature security member 56, a proper material is selected from a material the same in nature as, and different from, the semiconductor substrate 70 and, more preferably, a material having a smaller specific heat. It is, therefore, necessary for the temperature security member 56 to have an inner opening 58 similar in outline to, and somewhat greater than, the substrate 70. A dimensional difference between he outline of the substrate 70 and the inner opening 58 of the temperature security member provides a gap 62 of, for example, about 0.5 mm. If therefore, an orientation flat is present in a semiconductor wafer to be treated, then a corresponding portion is provided at the inner opening 58 of the temperature security member.

It is not always necessary that the temperature security member 56 be of a fully continuous ring type. For example, it is of a split type having four segments in which case some spacing may be left between the segments.

It is desirable that the thickness of the temperature security member 56 be the same as, and greater than, that of the substrate 70. In the present embodiment, the temperature security member 56 has the same thickness as that of the substrate 70.

The temperature security member 56 is located relative to the substrate 70 in substantially the same plane and, preferably, is positioned within the chamber 10 before the substrate 70 is loaded within the chamber. In the present embodiment, a plurality of quartz pins 64 are circumferentially welded to the lower surface of the window plate 22 with a center axis of the window plate as a reference. The temperature security member 56 is securely supported by the pins 64. The platen 18 is lifted by the lifting mechanism so that the substrate 70 is placed in a predetermined position for heat treatment. In this state, the temperature security member 56 is centered in substantially the same plane relative to the substrate 70 with a small gap 62 defined therebetween.

In another form of the present invention, the support pins 52 for the temperature security member 56 are provided on a top surface 48 of the platen. The substrate 70, together with the temperature security member 56, is loaded into the chamber. However, this process is less desirable in terms of a process simplification.

The present apparatus is used in a manner as will be set forth below.

First, the present apparatus is placed in a lowered position as indicated by the dot-dash line in FIG. 1, it being ready for an operation to be performed. It is to be noted that a substrate 70 to be treated, such as a semiconductor wafer, is transferred to a position, while being sucked by a transfer mechanism including known flat plate-like arms not shown. The transfer arm is inserted between the support pins 52 of the platen 18 with the wafer 70 placed thereon. If any orientation flat exists in the wafer, the wafer 70 is positioned circumferentially relative to the configuration of the inner opening 58 of the temperature security member and then the transfer arm is somewhat lowered to allow the wafer 70 to be placed in a point contact relation on the three support pins. When, in this state, the arm is withdrawn, the substrate or wafer 70 is floated on the pins just over the platen 18.

Then, the platen 18 is lifted by the lifting mechanism to an upper extreme position as indicted by the solid line in FIG. 1 and the wafer 70 is sealed within the chamber 10. With the wafer thus positioned, the ring-like temperature security member 56 is automatically located relative to the wafer 70 and hence to a predetermined position necessary to perform a heat treatment according to the present invention. The automatic positioning of the wafer is achieved by having positioned the temperature security member 56 within the chamber 10 as set forth above. When the wafer of the same size is to be treated, an ideal positional relation is automatically obtained any number of times between the wafer 70 and the temperature security member 56 without further adjustment of the position of the temperature security member 56.

With the wafer 70 set to a predetermined position as indicated by the solid line in FIG. 1, the interior of the chamber 10 is occupied by a predetermined atmosphere and then light is emitted by the infrared-ray lamps 26 for illumination so that the wafer 70 is heated. That is, the upper surface of the substrate 70 is heated principally by direct light coming from the infrared lamps 26 and indirect light reflected back from the top plate 12 or the inner surface 32 of the upper frame. On the other hand, the rear surface of the wafer 70 is heated by light which, after passing through the window plate 22, is reflected back from the inner surface 38 of the lower frame and upper surface 48 of the platen 18 and passes across an air spacing 54 between the platen 18 and the wafer 70. Although heat may tend to be dissipated from around the wafer 70, it is prevented by the temperature security member 56. Since the heating of the wafer 70 is conducted as set forth above, not only the surface of the wafer 70 but also the wafer per se, including a bulk, is uniformly heated, thus preventing the occurrence of sip lines which might otherwise often occur in the interior of the wafer 70, particularly in the marginal edge portion of the substrate.

At the completion of the heating operation, the chamber 10 is cooled and returned back to the original state, followed by the lowering of the platen 18 to the lowest position as indicated by the dot-dash line in FIG. 1. The transfer arm is inserted between the support pins 52 of the platen 18 and the wafer 70 is removed out of the platen 18. Since a spacing 54 is defined by the support pins 52 between the rear surface of the wafer 70 and the upper surface 48 of the platen 48, a simpler arm action is ensured upon the loading and unloading of the wafer 70. Furthermore, it is possible to prevent generation of dust resulting from, for example, a frictional contact between the wafer 70 and platen.

Although the present invention has been explained in conjunction with the preferred embodiment, various changes and modifications may be made without departing the spirit and scope of the present invention.

What is claimed is:

1. An apparatus for heat-treating a substrate, comprising:
   a chamber for defining a closed space for receiving the substrate;
   an infrared-ray lamp arranged inside said chamber;
   a platen constituting part of said chamber;
   moving means for moving said platen to close and open said chamber and for simultaneously causing the substrate to be respectively loaded into said chamber and unloaded from said chamber;
   supporting means for supporting the substrate relative to said platen such that a space is defined between a reverse side of the substrate and a surface of said platen substantially opposite the reverse side of the substrate;
   a ring-like temperature security member for preventing heat dissipation from the substrate, said ring-like temperature security member being disposed around the substrate with a narrow gap therebetween;
   a quartz window plate located between said infrared-ray lamp and the substrate; and
   pin means, attached to said quartz window plate, for supporting said temperature security member.

2. An apparatus according to claim 1, wherein:

said infrared-ray lamp is arranged in an upper region of said chamber;

said platen constitutes a lower portion of said chamber;

said moving means moves said platen substantially up and down;

said supporting means supports the substrate in a floating condition just over said platen; and said pin means used for supporting said ring-like temperature security member are attached to a lower surface of said quartz window plate.

3. An apparatus according to claim 2, wherein said platen has an upper surface which is exposed to an inside of said chamber and which is specularly polished to provide a reflection face.

4. The apparatus according to claim 1, in which said supporting means for supporting the substrate is made up of a plurality of heat-resistant support pins attached to said platen.

5. The apparatus according to claim 4, in which said support pins are three in number.

6. An apparatus according to claim 4, wherein said support pins are elastically movable up and down.

7. The apparatus according to claim 1, in which said temperature security member has a thickness equal to, or greater than, that of said substrate.

8. The apparatus according to claim 1, in which one sheet of substrate is treated at a time in one heat-treating cycle.

9. An apparatus according to claim 1, wherein said pin means includes quartz pins.

10. An apparatus for heat-treating a substrate having upper and lower surfaces which each lie substantially in a different plane, comprising:

a chamber for defining a closed space for receiving the substrate;

a substrate heating source including an infrared-ray lamp arranged inside said chamber;

a platen constituting part of said chamber;

moving means for moving said platen to open and close said chamber and for simultaneously causing the substrate to be respectfully loaded into said chamber and unloaded from said chamber;

a plurality of heat-resistant pins for supporting the substrate, said pins causing a space to be defined between the lower surface of the substrate and a surface of said platen which faces the lower surface of the substrate; and a ring-like temperature security member which is disposed around the substrate, with an narrow gap maintained with reference to the substrate, said ring-like temperature security member being of a non self-heating type and being heated by use only of the substrate heating source, said ring-like temperature security member having a thickness substantially equal to a thickness of the substrate and including upper and lower side surfaces which are located substantially in the same planes as the different planes of the upper and lower surfaces of the substrate, respectively, and said temperature security member being supported in such a manner as to define a space with reference to a surface of said platen which faces said ring-like temperature security member.

* * * * *

UNITED STATES PATENT AND TRADEMARK OFFICE
CERTIFICATE OF CORRECTION

PATENT NO. : 4,958,061

DATED : September 18, 1990

INVENTOR(S) : Tsuyoshi Wakabayashi et al

It is certified that error appears in the above-identified patent and that said Letters Patent is hereby corrected as shown below:

On the title page item [75] Inventors: should read
--Tsuyoshi Wakabayashi, Kofu; Shigehito Ibuka, Kofu;
and Tsunehiko Kitamura, Higashiyamato, all of Japan--.

Signed and Sealed this

Twenty-first Day of April, 1992

Attest:

HARRY F. MANBECK, JR.

*Attesting Officer*     *Commissioner of Patents and Trademarks*